United States Patent [19]
Anderson et al.

[11] Patent Number: 5,920,211
[45] Date of Patent: Jul. 6, 1999

[54] FULLY DIGITAL CLOCK SYNTHESIZER

[75] Inventors: Michael B. Anderson; Gregory A. Tabor, both of Colorado Springs, Colo.

[73] Assignee: LSI Logic Corporation, Milpitas, Calif.

[21] Appl. No.: 08/825,082

[22] Filed: Mar. 27, 1997

[51] Int. Cl.[6] .......................... H03B 19/00; H03K 3/017
[52] U.S. Cl. .................. 327/116; 327/105; 327/113; 327/114; 327/261; 327/269; 327/294; 327/299
[58] Field of Search .................................. 327/119, 269, 327/395, 105, 113, 114, 115, 116, 117, 164, 261, 294, 299

[56] References Cited

U.S. PATENT DOCUMENTS

| | | | |
|---|---|---|---|
| 5,216,301 | 6/1993 | Gleeson, III et al. | 327/269 |
| 5,399,995 | 3/1995 | Kardontchik et al. | 331/17 |
| 5,479,125 | 12/1995 | Tran | 327/119 |
| 5,506,878 | 4/1996 | Chiang | 377/39 |
| 5,530,387 | 6/1996 | Kim | 327/119 |

*Primary Examiner*—Dinh Le
*Attorney, Agent, or Firm*—Wayne P. Bailey; Duke W. Yee

[57] ABSTRACT

A fully digital clock multiplier capable of generating any N/M multiple of an input clock frequency with a precise duty cycle is provided. The input clock signal is divided by M to create a divided clock signal. The propagation of the input clock signal along a delay cell string during a half cycle of the divided clock signal is then measured. The measured propagation is then scaled by a factor N to select an appropriate delay cell string length within a ring oscillator for generating an output signal.

19 Claims, 5 Drawing Sheets

5,920,211

FULLY DIGITAL CLOCK SYNTHESIZER

BACKGROUND OF THE INVENTION

1. Technical Field

The present invention relates generally to generating clock signals for integrated circuits and in particular to multiplying clock signals within an integrated circuit. Still more particularly, the present invention relates to a fully digital clock multiplier providing N/M clock frequency multiplication while maintaining precise duty cycles.

2. Description of the Related Art

Clock multipliers are widely employed in modern semiconductor devices. A common implementation involves a phase lock loop (PLL), using analog circuits such as a phase/frequency detector and a charge pump to bias a voltage controlled oscillator (VCO) such that a divided version of the VCO matches a reference clock. Because they require analog components, however, these multipliers cannot be built from a purely digital library, utilizing processing technology optimized for purely digital circuits. Moreover, such multipliers have long acquisition times, usually on the order of hundreds to thousands of clock cycles.

A technique employed for digitally doubling a clock involves XORing a reference clock signal with the same signal delayed by 90 degrees (one quarter clock cycle) as shown in FIG. 5A. The XORed output will have a frequency which is twice the frequency of the reference clock signal, as depicted in FIG. 5B. However, ordinary circuit delay elements vary widely with changing operating parameters such as voltage, temperature, and variances in integrated circuit processing. As a result, the clock duty cycle will vary widely for the doubled clock, as illustrated in FIGS. 5C and 5D.

The XOR method of clock doubling described is also limited to obtaining a frequency which is twice the reference clock frequency. Thus, even if a method of adding a precise amount of delay (90 degrees) between the XOR inputs were devised, the frequency range achievable would be limited. At best, the frequencies which could be obtained from such a mechanism would be some power of two times the reference clock frequency.

It is desirable, therefore, to provide a clock multiplier which may be implemented with only digital components and fabricated using only digital processes. It is also desirable to provide a clock multiplier capable of producing a frequency which is any whole number or fractional multiple of the input or reference clock frequency. It would also be advantageous to obtain a precise duty cycle in the output clock signal.

SUMMARY OF THE INVENTION

A fully digital clock multiplier capable of generating any N/M multiple of an input clock frequency with a precise duty cycle is provided. The input clock signal is divided by M to create a divided clock signal. The propagation of the input clock signal along a delay cell string during a half cycle of the divided clock signal is then measured. The measured propagation is then scaled by a factor N to select an appropriate delay cell string length within a ring oscillator for generating an output signal.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
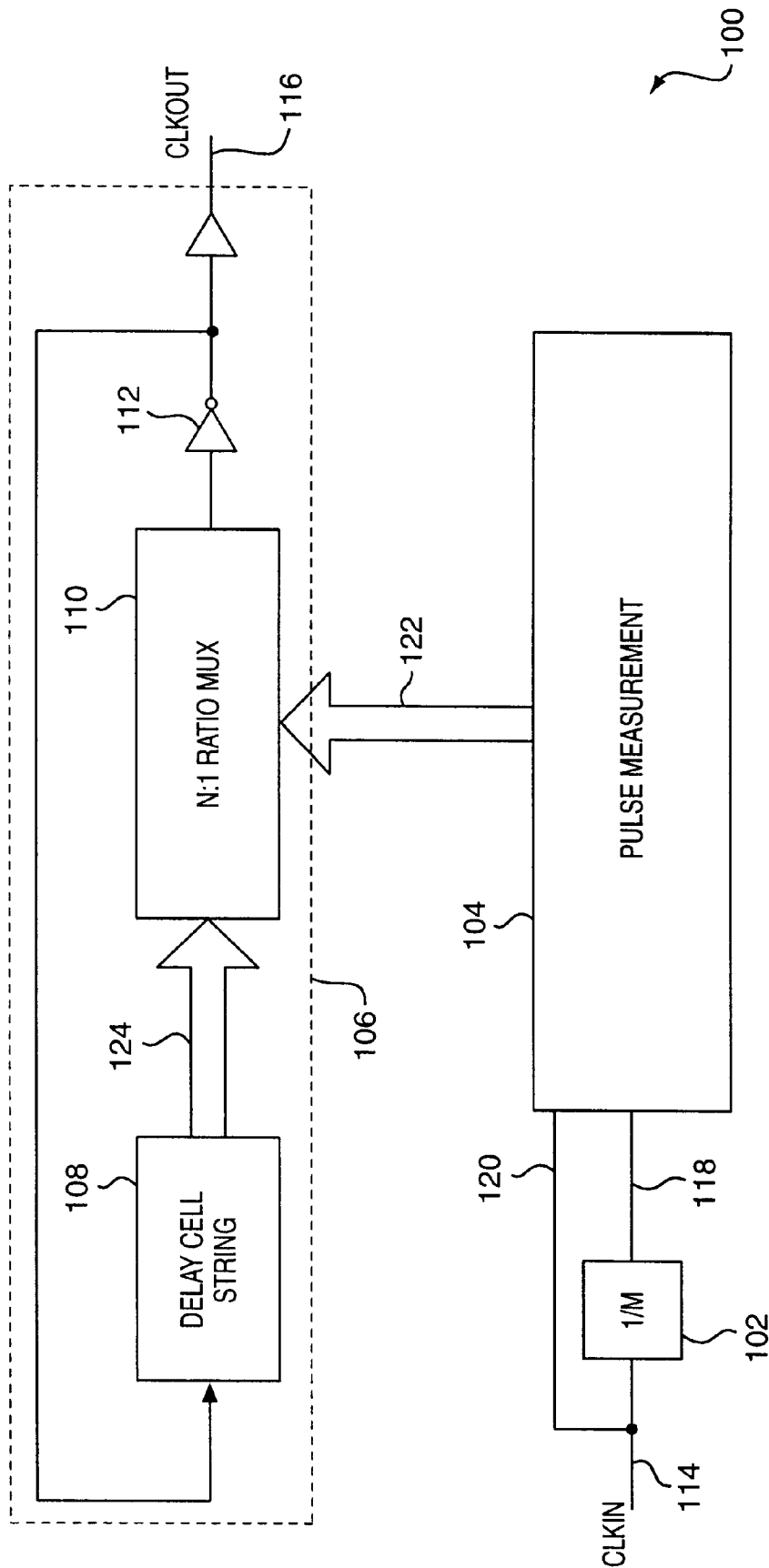
FIG. 1 depicts a block diagram of a clock multiplier in accordance with a preferred embodiment of the present invention.

With reference now to the figures, and in particular with reference to FIG. 1, a block diagram of a clock multiplier in accordance with a preferred embodiment of the present invention is depicted. Clock multiplier 100 comprises a simple digital clock divider 102, a pulse measurement circuit 104, and a ring oscillator 106. Clock divider 102 is a divide-by-M circuit. Ring oscillator 106 includes a string of delay cells 108, a scaling multiplexer 110, and an inversion stage 112. Scaling multiplexer 110 is a N:1 ratio multiplexer.

In operation, clock multiplier 100 receives an input square wave clock signal at input 114 and produces an output square-wave clock signal of frequency N/M times the input clock frequency at output 116. To accomplish this, clock divider 102 feeds pulse measurement circuit 104. Clock divider 102 permits fractional multiplication of the input or reference clock frequency. Clock divider 102 should produce a 50% duty cycle on the resultant divided clock waveform. A 50% duty cycle is important since only the divided clock signal high time (or, alternatively, the divided clock signal low time) is measured by the pulse measurement circuit. The divided clock signal high time (or low time) should be a whole multiple of the reference clock period. For example, a divide-by-2 clock divider should produce a divided clock signal waveform with a high time (and low time) equivalent to the period of the reference clock signal. A divide-by-2 clock divider satisfying this requirement may be implemented by a simple edge-triggered flip-flop with its complimentary output fed back to the data input, clocked by the reference clock signal.

Both the divided clock signal and the reference clock signal are passed from clock divider 102 to pulse measurement circuit 104 at inputs 118 and 120, respectively. Pulse measurement circuit 104 measures a number of uniform time increments required for the reference clock signal to complete M/2 cycles within a half-period of the divided clock signal. For example, if a divide-by-2 clock divider is utilized, pulse measurement circuit 104 measures a number of uniform time increments required for the reference clock signal to complete one cycle. The reference clock may then be divided by simply generating a signal with a period which, measured in the same uniform time increments, may be evenly divided into the number of time increments counted for the reference clock signal. For example, if pulse measurement circuit 104 determines that a reference clock period requires 16 time increments, the reference clock signal may be divided by generating a signal with a period of 4 time increments.

The time increments counted by pulse measurement circuit 104 are smaller than half the reference clock period. The size of the time increments in which the reference clock is measured is selected based, at least in part, on the multiple of the reference clock frequency which is desired. For the design described below, the time increment need not be capable of being evenly divided into the reference clock period (i.e., the reference clock period need not be a whole multiple of the time increment selected).

Ring oscillator 106 generates the output signal of clock multiplier based on signal lines 122 passing an encoded signal from pulse measurement circuit 104 for the number of time increments counted for a reference clock period. Ring oscillator 106 employs delay cell string 108 and multiplexer 110 to generate an output signal at output 116 with a period which is an even divisor of the reference clock signal period. Delay cell string 108 passes an encoded signal via signal lines 124 reflecting a number of time increments which should be employed in a half-period of the output signal generated by ring oscillator 106.

Figure 2:
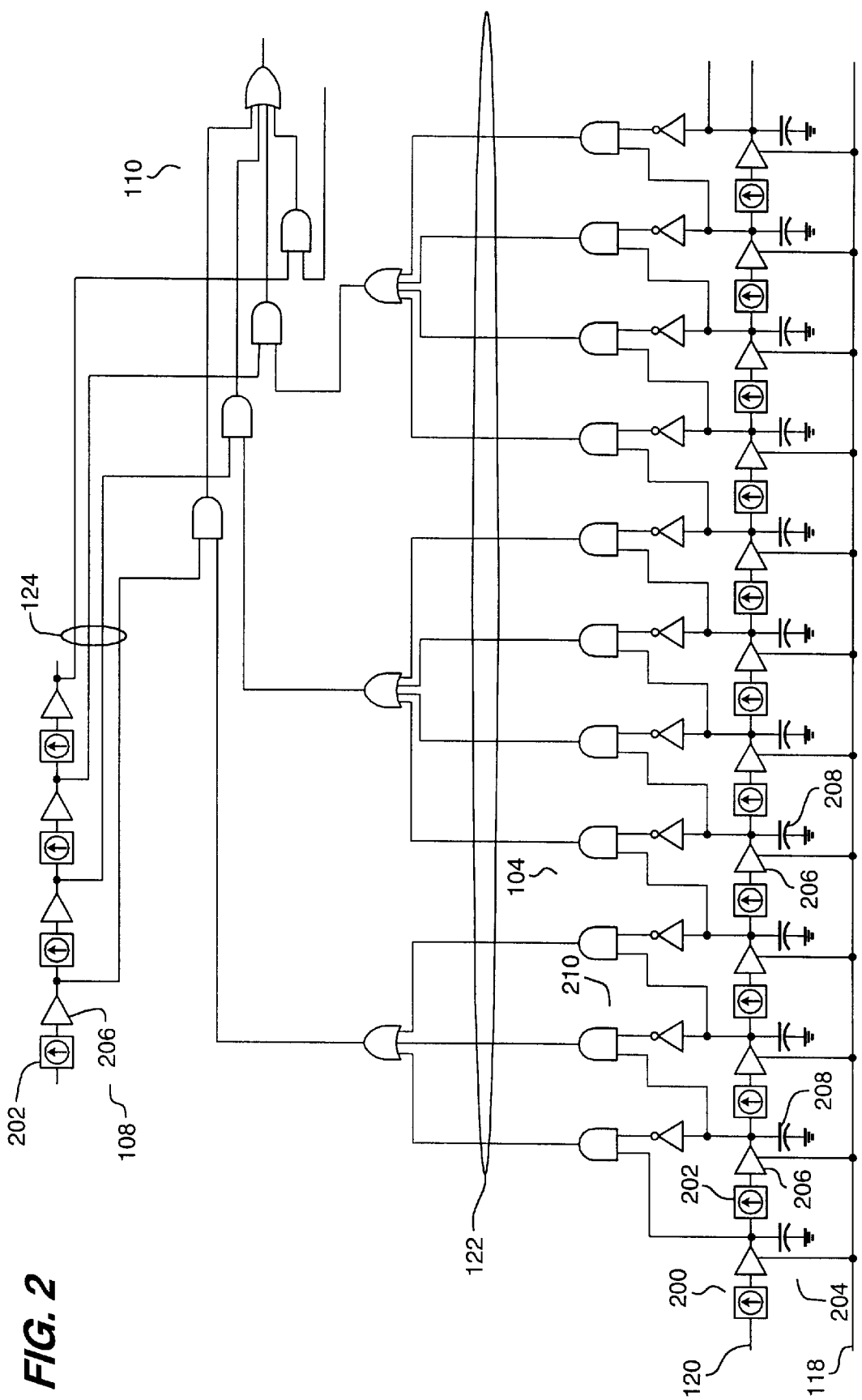
FIG. 2 is one embodiment of the pulse measurement circuit, delay cell string, and multiplexer in a clock multiplier in accordance with a preferred embodiment of the present invention.

Referring to FIG. 2, one embodiment of the pulse measurement circuit, delay cell string, and multiplexer in a clock multiplier in accordance with a preferred embodiment of the present invention is shown. The embodiment depicted implements a clock doubler for a divide-by-2 clock divider (i.e., N=4 and M=2), although other variations are possible.

In the embodiment depicted, pulse measurement circuit 104 includes a measurement string 200 of delay units 202 alternated with latches 204. Latches 204 in the depicted embodiment are dynamic latch cells including tristate buffers 206 and capacitors 208. Any static or dynamic latch may be employed, but dynamic latches such as are shown are preferred for their high speed and small size.

The reference clock signal is received by measurement string 200 of delay cells 202 and latches 204 at input 120, and the divided clock signal at input 118. Latches 204 are controlled by the divided clock signal. During the time when the divided clock signal is high, latches 204 are "open" and the reference clock signal is allowed to propagate freely along measurement string 200. Therefore, assuming the divided clock signal is initially low, the reference clock signal cannot begin propagating along measurement string 200 until the divided clock signal goes high. Due to the manner in which the divided clock signal is generated (divide-by-2 as described above), the time at which the divided clock signal goes high will coincide with the start of the reference clock period, when the reference clock is high. Similarly, the time at which the divided clock signal subsequently goes low will coincide with the end of the reference clock period. The reference clock signal will thus propagate along measurement string 200 for the duration of the reference clock period.

When the divided clock signal transitions from high to low, latches 204 close and the states on measurement string 200 are held. At the time of this transition, the output values of each delay cell should be captured into a second stage latch (not shown) for encoding and transmission to the ring oscillator. A count of the number of delay cell delay periods in the reference clock period may then be ascertained by identifying the last delay cell in measurement string 200 through which the reference clock signal propagated. In other words, the reference clock period is measured as being "x" delay cells in duration.

At the time of the divided clock signal transition from high to low, the delay cell outputs should be, from the start of measurement string 200, a series of "1" or high outputs followed by a series of "0" or low outputs. The point along measurement string 200 at which the delay cell output sequence transitions from "1" to "0" represents the number of delay cells through which the reference clock signal propagated during the time the divided clock signal was high. This point may be identified by ANDing each delay cell output with an inverted output from the next delay cell in measurement string 200, as depicted by detection gate 210.

Delay cell string 108 includes the same delay cells 202 alternated with latches 206 employed in measurement string 200. Latches 206 are included to provide a delay structure which matches measurement string 200. The physical layout of these circuits in a circuit implementation should be matched as well.

Scaling multiplexer 110 selects one of the delay cell outputs in delay cell string 108, which are passed to scaling multiplexer 110 from delay cell string 108 via signal lines 124, to forward to the inversion stage of the ring oscillator. As depicted in FIG. 1, the ring oscillator inversion stage feeds back to the input of delay cell string 108.

The selection logic in scaling multiplexer 110 includes one logic gate for each delay cell output in delay cell string 108. Scaling multiplexer 110 achieves N:1 scaling by logically ORing together N consecutive signal lines 122 connected to detection gates 210 in pulse measurement circuit 104. The logically ORed signals are used to select an appropriate delay cell output. Thus, if the 1–0 transition is detected at the output of delay cell x in pulse measurement string 200, the output of delay cell x/N in delay cell string is selected by scaling multiplexer 110.

It should be noted that the number of delay cells employed in measurement string 200 and delay cell string 108 do not affect the factor by which the reference clock frequency is multiplied. Instead, the scaling (N:1) between the number of delay cells in measurement string 200 which are used to select a corresponding delay cell in delay cell string 108 influences the frequency multiplication factor (N/M). With a divide-by-2 clock divider, for example, scaling of 6:1 in scaling multiplexer 110 which achieve clock tripling. Thus, the number of delay cells employed in either measurement string 200 or delay cell string 108 is a matter of design choice, provided at least an N:1 ratio between measurement string 200 and delay cell string 108 is maintained.

Figure 3:
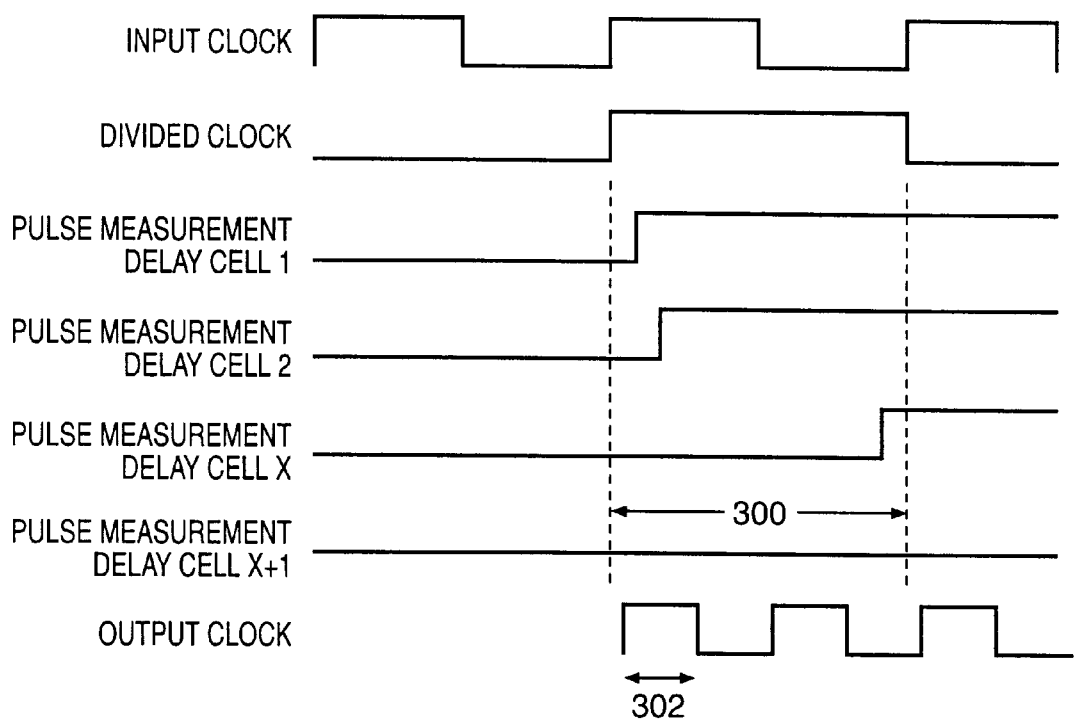
FIG. 3 depicts a timing diagram for operation of a clock multiplier in accordance with a preferred embodiment of the present invention.

With reference now to FIG. 3, a timing diagram for operation of a clock multiplier in accordance with a preferred embodiment of the present invention is depicted. The input clock signal is divided by two to create the divided clock signal. When the divided clock signal goes high, the input clock signal is passed along the measurement string. Thus, pulse measurement string delay cell 1 goes high one delay period after the divided clock goes high, pulse measurement string delay cell 2 goes high two delay periods after the divided clock goes high, and so on. Pulse measurement string delay cell x goes high x delay periods after the divided clock goes high, but the divided clock goes low before pulse measurement string delay cell x+1 goes high. The 1–0 transition of the propagated input clock pulse on the measurement string spans delay cells x and x+1. Thus, the measured duration 300 of the input clock in at least x but less than x+1 delay periods. By scaling the delay periods by 4:1 for the ring oscillator, a output clock signal will be high for a duration 302 of x/4 delay periods. This results in a doubled clock frequency. As depicted, however, the output clock signal is not necessarily synchronous with the input clock signal.

As described earlier, the delay period used to measure the input clock and to generate a delay for the ring oscillator need not be an exact divisor of the input clock period. Because the output clock signal generation keys off the input clock, the output clock signal generation is self-corrected every input clock period. Any variance in the output clock duty cycle is limited to the last half-cycle of the output clock signal during a given input clock period, and is diminished by the scaling. The effect may be further diminished by using shorter delay periods to measure the input clock period.

Figure 4:
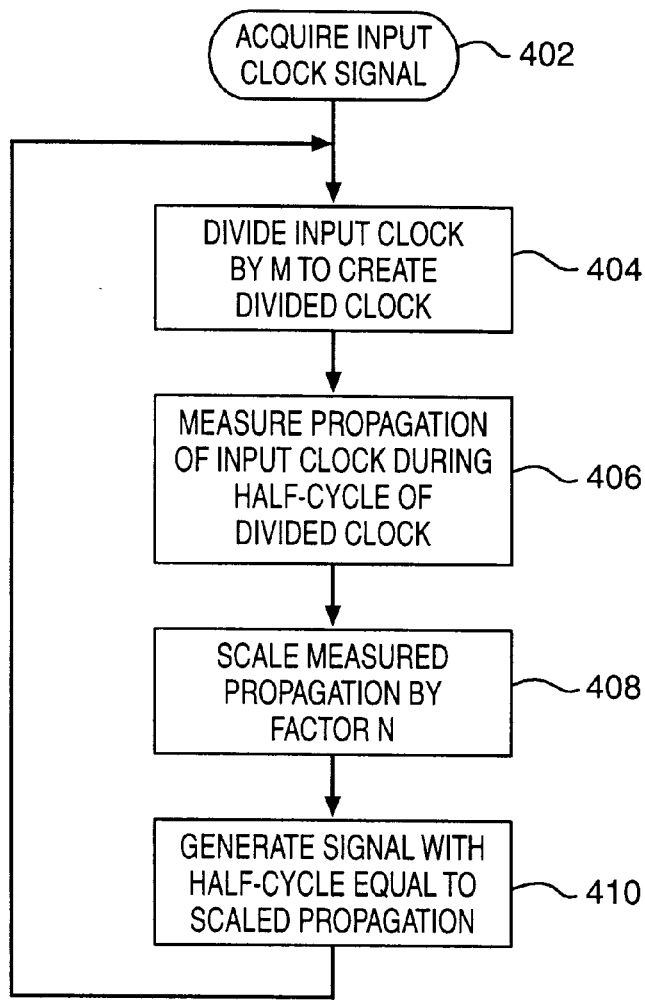
FIG. 4 is a high level flowchart for a process for multiplying a clock signal in accordance with a preferred embodiment of the present invention.
Figure 5A:
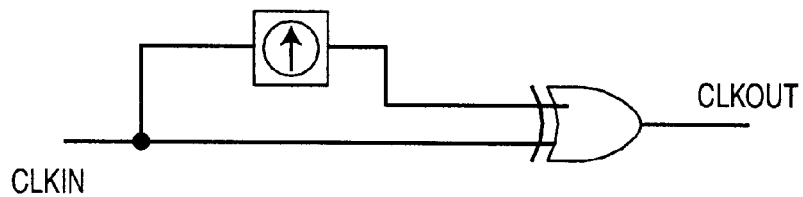
FIGS. 5A–5D depict a prior art system of multiplying a clock signal and timing diagrams for that system.
Figure 5B:
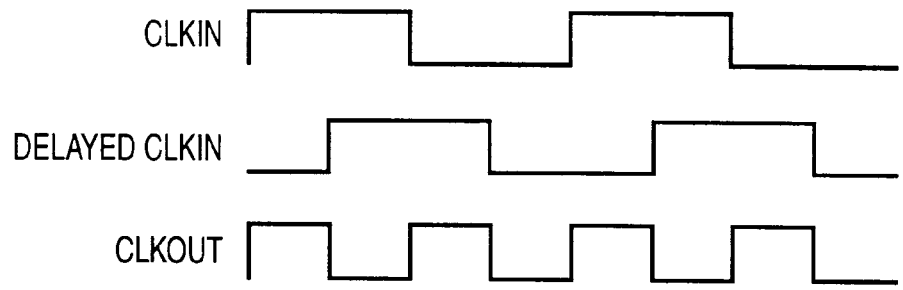
Figure 5C:
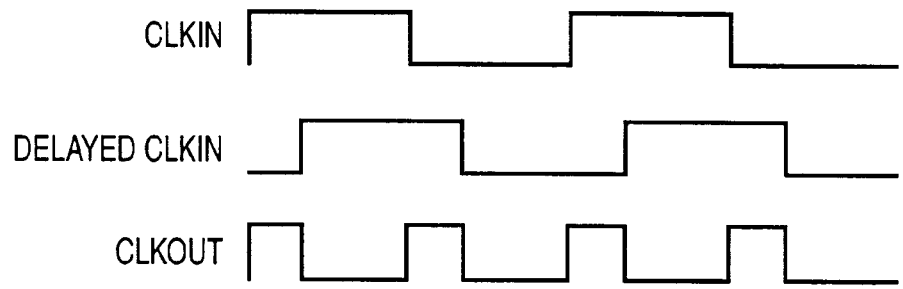
Figure 5D:
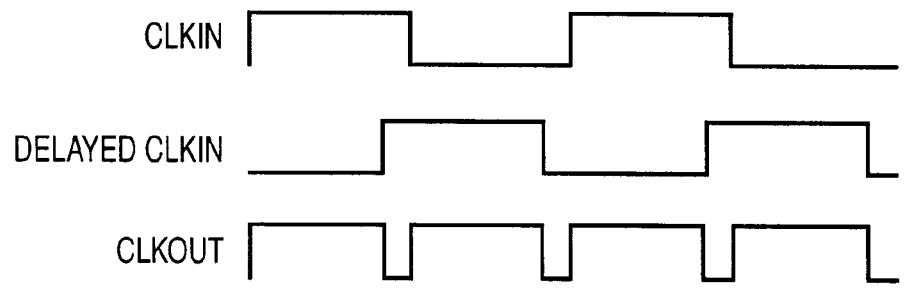

Referring to FIG. 4, a high level flowchart for a process for multiplying a clock signal in accordance with a preferred embodiment of the present invention is shown. The process begins at step 402, which depicts acquisition of an input clock signal. The process then passes to step 404, which illustrates dividing the input clock signal by M to create a divided clock signal, and then to step 406, which depicts measuring the propagation of the input clock signal along a delay cell string during a half cycle of the divided clock. The process next passes to step 408, which illustrates scaling the measured propagation of the input clock signal by a factor N, and to step 410, which depicts generating a signal with a half cycle equal to the scaled propagation. As depicted, from step 410 the process returns to step 404 and is repeated for each cycle of the divided clock until interrupted, such as by loss of power.

The present invention provides a fully digital clock multiplier capable of generating any N/M multiple of an input clock frequency with a precise duty cycle. Being fully digital, the clock multiplier may be formed from existing components in a digital library and manufactured by processes optimized for digital devices. Whole multiples or fractional multiples, or combinations of different multiples, of an input clock frequency may be generated. The duty cycle of the output (multiplied) clock signal is accurate to within one delay cell period scaled by the factor N, self-corrected during every input clock cycle.

Because the clock multiplier is fully digital, power or space savings may be achieved. In some applications, the short acquisition time (approximately two input clock cycles) may provide a critical advantage over traditional analog phase lock loop implementations.

Although the output signal is not synchronous with the reference clock in the exemplary embodiment, the design may be suitably modified if such synchronicity is required.

The circuits described may also be applied to introduce controlled phase delay, rather than merely for synthesizing clock frequencies. Providing a clock with a phase that slightly leads a reference clock would be useful in improving a circuit's ability to sample a signal with very tight setup or hold time requirements. For example, 66 MHz PCI interfaces have a specified setup time of 3 ns and hold time of 0 ns for many of the bus signals, making it difficult if not impossible to capture such signals after they have propagated through any logic.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A clock synthesizer, comprising:
    a clock divider receiving an input clock signal and generating a divided clock signal by dividing the input clock signal by M;
    a pulse measurement circuit having a plurality of outputs, the pulse measurement circuit receiving the input clock signal and the divided clock signal for measuring a propagation time of the input clock signal to form a measured propagation time, and generating a plurality of output signals indicating the measured propagation time; and
    a ring oscillator receiving the output signals from the pulse measurement circuit for scaling the measured propagation time by N to generate an output clock having a frequency of N/M times a frequency of the input clock signal, wherein M and N are numbers greater than zero.

2. The clock synthesizer of claim 1, wherein the pulse measurement circuit measures the propagation time of the input clock signal during a half-cycle of the divided clock signal and the ring oscillator generates the output clock signal during said half-cycle of the divided clock signal.

3. The clock synthesizer of claim 1, wherein the ring oscillator comprises:
    a delay cell string having a plurality of outputs;
    a scaling multiplexer selecting an output of the delay cell string to generate an output signal;
    an inverter inverting the output signal of the scaling multiplexer to generate said output clock signal; and
    a feedback loop passing the inverted output signal of the scaling multiplexer to an input of the delay cell string, wherein the inverted output signal of the scaling multiplexer propagates along the delay cell string.

4. The clock synthesizer of claim 1, wherein the pulse measurement circuit comprises:
    a pulse measurement string comprising a plurality of delay cells alternated with a set of latches, the pulse measurement string receiving the input clock signal and allowing the input clock signal to propagate along the pulse measurement string during a half-cycle of the divided clock signal; and
    a plurality of AND gates, each AND gate within the plurality of AND gates respectively receiving an output of a latch within the set of latches within the pulse measurement string and an inverted output of a subsequent latch within the set of latches within the pulse measurement string, to generate an output signal of the plurality of the output signals.

5. The clock synthesizer of claim 4, wherein said latch within the set of latches comprises:
    a tristate buffer receiving an output of a preceding delay cell, the tristate buffer controlled by the divided clock signal; and
    a capacitor connecting an output of the tristate buffer to a ground.

6. The clock synthesizer of claim 2, wherein the pulse measurement circuit comprises:
    a pulse measurement string comprising delay cells alternated with a set of latches, the pulse measurement string receiving the input clock signal and allowing the input clock signal to propagate along the pulse measurement string during a half-cycle of the divided clock signal; and
    a plurality of AND gates, each AND gate within the plurality of AND gates respectively receiving an output of a latch within the set of latches within the pulse measurement string and the inverted output of a subsequent latch within the set of latches within the pulse measurement string, to generate an output signal of the plurality of the output signals.

7. The clock synthesizer of claim 6, wherein the ring oscillator comprises:

a delay cell string comprising a plurality of delay cells alternated with a set of latches, each delay cell within the plurality of delay cells matching said delay cells within the pulse measurement string;

a scaling multiplexer for scaling outputs of the pulse measurement circuit to select an output of a corresponding delay cell string latch to generate an output signal;

an inverter inverting the output signal of the scaling multiplexer to generate the output clock signal; and a feedback loop passing the inverted output signal of the scaling multiplexer to an input of the delay cell string, wherein the inverted output signal of the scaling multiplexer propagates along the delay cell string.

8. The clock synthesizer of claim 7, wherein the scaling multiplexer comprises:

a plurality of N input OR gates receiving the outputs of said pulse measurement circuit;

a plurality of multiplexer AND gates each receiving a corresponding output of an OR gate of said plurality of N input OR gates and said output of said corresponding delay cell string latch; and a logic gate combining outputs of the multiplexer AND gates to generate the output clock signal.

9. The clock synthesizer of claim 8, wherein the plurality of N input OR gates further comprise 4 input OR gates.

10. The clock synthesizer of claim 9, wherein said clock divider generates said divided clock signal having a frequency of twice said frequency of the input clock signal.

11. A fully digital clock multiplier within an integrated circuit, comprising:

a clock divider receiving an input clock signal and generating a divided clock signal having a frequency of M times the input clock signal;

a pulse measurement string allowing the input clock signal to propagate along the pulse measurement string while the divided clock signal is high;

a transition detector indicating propagation time along the pulse measurement string by detecting a transition of the input clock signal from a first state to a second state within the pulse measurement string;

a scaling multiplexer circuit scaling the propagation time indicated by the transition detector by a factor of N to create a scaled propagation time and selecting an output of a delay cell string to generate an output clock signal; and wherein said output clock signal propagates along said delay cell string for the scaled propagation time; and wherein the output clock signal has a frequency of N/M times a frequency of the input clock signal, wherein M and N are numbers greater than zero.

12. The clock multiplier of claim 11, wherein the output clock signal propagates along the delay cell string for the scaled propagation time before being passed to an inverter for generating the output clock signal.

13. A method of synthesizing a multiplied clock signal, comprising:

receiving an input clock signal;

dividing the input clock signal by M to create a divided clock signal;

measuring propagation time of the input clock signal;

scaling the measured propagation time of the input clock signal by a factor of N to generate a scaled propagation time of the input clock signal; and generating a signal having a frequency of N/M times the frequency of the input clock signal, wherein M and N are numbers greater than zero.

14. The method of claim 13, wherein:

the step of measuring propagation time of the input clock signal further comprises measuring propagation time of the input clock signal during a half-cycle of the divided clock signal; and the step of generating a signal further comprises generating said signal with said half-cycle equal to the scaled propagation time of the input clock signal.

15. The method of claim 14, wherein M is equal to 2.

16. The method of claim 13, wherein the step of measuring propagation time of the input clock signal further comprises measuring propagation time of the input clock signal along a delay cell string.

17. The method of claim 14, wherein M is equal to 4.

18. The method of claim 14, wherein the step of generating said signal with said half-cycle equal to the scaled propagation time further comprises setting a delay within a ring oscillator to equal the scaled propagation time.

19. A clock synthesizer, comprising:

a clock divider receiving an input clock signal and generating a divided clock signal at the output by dividing the input clock signal by M;

a pulse measurement circuit receiving the input clock signal and the divided clock signal, measuring a propagation time of the input clock signal during a half-cycle of the divided clock signal to form a measured propagation time, and generating a signal corresponding to the measured propagation time; and a ring oscillator circuit, wherein the receiving the signal from the pulse measurement circuit and scaling the measured propagation time by N using the signal to generate an output clock signal having M half-cycles during each divided clock signal half cycle, wherein the output clock signal has a frequency of N/M times a frequency of the input clock signal, wherein M and N are numbers greater than zero.

* * * * *